United States Patent
Lazaro Gallego

(10) Patent No.: US 7,009,157 B2
(45) Date of Patent: Mar. 7, 2006

(54) PROCEDURE FOR SOLDERING THE CONSTITUENT LAYERS OF A MULTILAYER PRINTED CIRCUIT AND THE MACHINE USED FOR SAME

(75) Inventor: Victor Lazaro Gallego, Santa Perpetua de Mogoda (ES)

(73) Assignee: Chemplate Materials, Santa Perpetua de Mogoda (ES)

( * ) Notice: Subject to any disclaimer, the term of this patent is extended or adjusted under 35 U.S.C. 154(b) by 43 days.

(21) Appl. No.: 10/498,236

(22) PCT Filed: May 27, 2002

(86) PCT No.: PCT/ES02/00247

§ 371 (c)(1),
(2), (4) Date: Jun. 10, 2004

(87) PCT Pub. No.: WO03/056888

PCT Pub. Date: Jul. 10, 2003

(65) Prior Publication Data

US 2005/0023275 A1 Feb. 3, 2005

(30) Foreign Application Priority Data

Dec. 28, 2001 (ES) ................. 200102902

(51) Int. Cl.
*B23K 1/002* (2006.01)

(52) U.S. Cl. .................................... 219/616

(58) Field of Classification Search ........... 219/616, 219/617, 85.1, 615, 605, 636

See application file for complete search history.

(56) References Cited

U.S. PATENT DOCUMENTS

| 2,803,731 | A | * | 8/1957 | Coburn | 219/616 |
| 3,835,531 | A | | 9/1974 | Luttmer | |
| 4,983,804 | A | * | 1/1991 | Chan et al. | 219/616 |
| 5,262,592 | A | * | 11/1993 | Aldissi | 174/36 |
| 5,523,617 | A | * | 6/1996 | Asanasavest | 257/666 |
| 5,603,795 | A | | 2/1997 | Paulauskas et al. | |
| 5,984,166 | A | * | 11/1999 | Holzmann | 228/254 |
| 6,229,124 | B1 | * | 5/2001 | Trucco | 219/605 |
| 6,871,776 | B1 | * | 3/2005 | Trucco | 228/234.1 |

FOREIGN PATENT DOCUMENTS

| EP | 625868 | 11/1994 |
| EP | 0 891 862 | 1/1999 |
| WO | WO 8700123 | 1/1987 |
| WO | WO 9502509 | 1/1995 |

* cited by examiner

*Primary Examiner*—Daniel Robinson
(74) *Attorney, Agent, or Firm*—Sughrue Mion, PLLC

(57) ABSTRACT

Procedure for soldering the constituent layers of a multilayer printed circuit and machine for performing it.

The procedure is applicable to circuits made up of layers containing the circuit image (2, 3, 4, 5,) that have perimetral strips (9) including reserve areas (11), superimposed and separated from each other by isolating layers (6, 7 and 8). The procedure includes the following steps: i) place a heater circuit (13) composed of a flat winding with at least one turn in short-circuit (14) in each reserve area (11); ii) superimpose the layers that contain the circuit image (2, 3, 4, 5,) and the isolating layers (6, 7 and 8) in alternating order; iii) secure the position of the layers relative to the others, thereby creating groups (12) of reserve areas (11); iv) place induction electrodes (18) over the groups (12) of reserve areas; v) soldering each one of the groups (12) by application of a magnetic field of variable induction.

2 Claims, 2 Drawing Sheets

PROCEDURE FOR SOLDERING THE CONSTITUENT LAYERS OF A MULTILAYER PRINTED CIRCUIT AND THE MACHINE USED FOR SAME

CROSS-REFERENCE TO RELATED APPLICATION

This application is a 371 of PCT/ES02/00247, filed May 27, 2002; the disclosure of which is incorporated herein by reference.

TECHNICAL SECTOR OF THE INVENTION

The object of the invention is a procedure for soldering the constituent layers of multilayer printed circuits made up of various layers that have the circuit image superimposed on them and are separated from each other by isolating layers, as well as a machine for performing it.

PRECEDENTS

Multilayer printed circuits composed of multiple layers fitted out with respective circuit images and separated from each other by isolating layers are well known. Broadly speaking, once the layers with the circuit image have been obtained, the manufacturing of a multilayer printed circuit requires alternating and superimposing these layers with isolating with a high degree of precision so as to enable the electrical interconnection between circuits of various layers and proceed immediately to the union of all the layers by hot pressing. Various methods for bonding the layers of multilayer printed circuits before pressing are known. One method essentially consists in providing perimetral strips on each layer with circuit image containing multiple reserve areas without the circuit image, such that the reserve areas, which occupy the same relative position in each layer containing a circuit image, are superimposed and, therefore, groups of superimposed reserve areas are defined; the layers are then immediately joined through a clinching operation performed on said reserve area groups. A second method essentially differs from the previous one in that the layers are bonded by simultanously solding of the layers of the multilayer printed circuit performed on said reserve area groups.

With the clinching method for joining layers, a high number of layers in the multilayer printed circuit leads to a loss in the mechanical precision necessary to proceed to the interconnection of the different layers containing circuit images, while with the method of joining layers by welding, a high number of layers leads to very long welding times and/or the impossibility to welder. The main drawback of both the clinching and welding methods for joining the layers of multilayer printed circuits is that the number of layers that may be joined is reduced, thereby limiting the production of circuits composed of high numbers of layers containing the circuit image, for example, of circuits with more than eight layers with the circuit image superimposed on them.

EXPLANATION OF THE INVENTION

The procedure for soldering the constituent layers of a multilayer printed circuit, is applicable to multilayer printed circuits made up of a mix of layers containing the circuit image and isolating layers, where the layers that have the circuit image also have perimetral strips on which a variety of reserve areas are located, in equal number and position for each layer.

The procedure designed in the invention is made up of the following steps:

i) place a heater circuit composed of a flat winding with at least one turn in short-circuit, in each reserve area of each layer containing a circuit image;

ii) arrange the layers containing circuit images so that they are superimposed and separated from each other by an isolating layer, in order to form the book of layers of the multilayer printed circuit such that there are distinct top and bottom layers that each contain the circuit image;

iii) position, the layers of the multilayer printed circuit, relative to each other, in such a way that the corresponding reserve areas of the layers with circuit image occupy the same relative position, forming groups of superimposed reserve areas and, consequently, groups of superimposed heater circuits;

iv) in each group of reserve areas with the heater circuits, place one induction electrode over the reserve area of the top layer containing the circuit image and a second induction electrode over the opposite side of the reserve area of the bottom layer containing the circuit image; and v) solder each group of reserve areas through the two induction electrodes, by application of a magnetic field of variable induction, which generates through induction into each turn in short-circuit of each heater circuit of each reserve area of each layer with a circuit image of a current intensity whose circulation through the turns in short-circuit produces heat for the soldering the layers of the multilayer circuit.

The machine to perform the procedure that is the object of the invention is composed of the elements listed below:

a structure which includes a minimum of one inductor device with a magnetic circuit of a general U form that contains an inductor coil, each outer point of each arm of the magnetic circuit having its own induction electrode, both of which are positioned coaxially to each other, and both with capacity of displacement in both directions;

a circuit board holder;

a device for attaching the book of layers of the multilayer printed circuit to the circuit board holder;

a movement control device for the circuit board holder, adapted to situate the groups of reserve areas between the pair of induction electrodes of the inductor device and perpendicularly to them; and a control device for each pair of induction electrodes, adapted to situate the electrodes in contact with the group of reserve areas, such that they exercise pressure on them.

BRIEF DESCRIPTION OF THE DRAWINGS

The pages of drawings in this report include illustrations, to serve as non-limiting examples, of the procedure for soldering the constituent layers of a multilayer printed circuit and the machine for performing it, which together are the object of the invention. In said drawings.

DETAILED DESCRIPTION OF DRAWINGS

Figure 1:
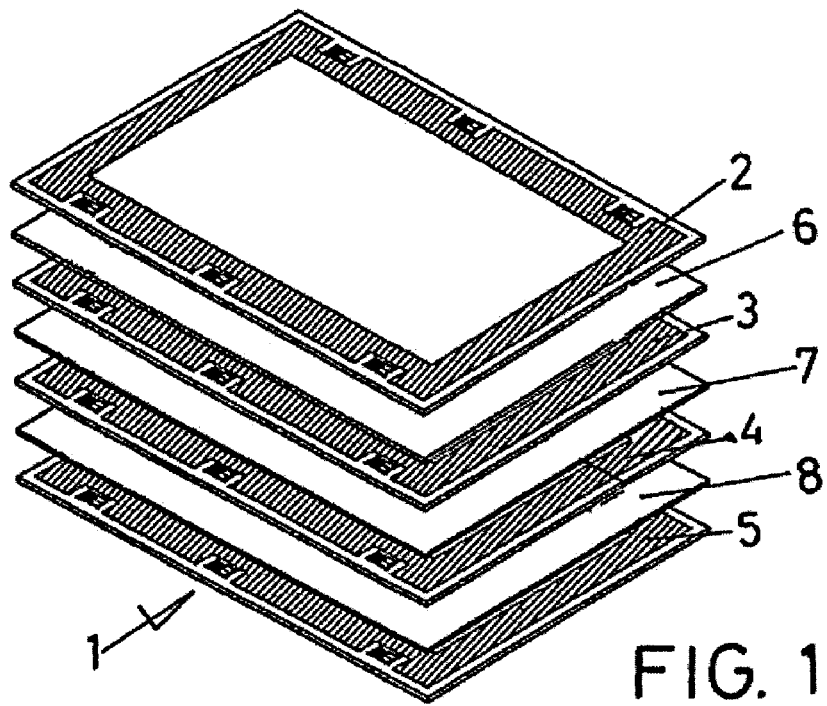
FIG. 1 is a view in perspective of the constituent layers that contain the circuit image and the isolating layers of a multilayer printed circuit, superimposed and prior to being secured for the soldering procedure.
Figure 2:
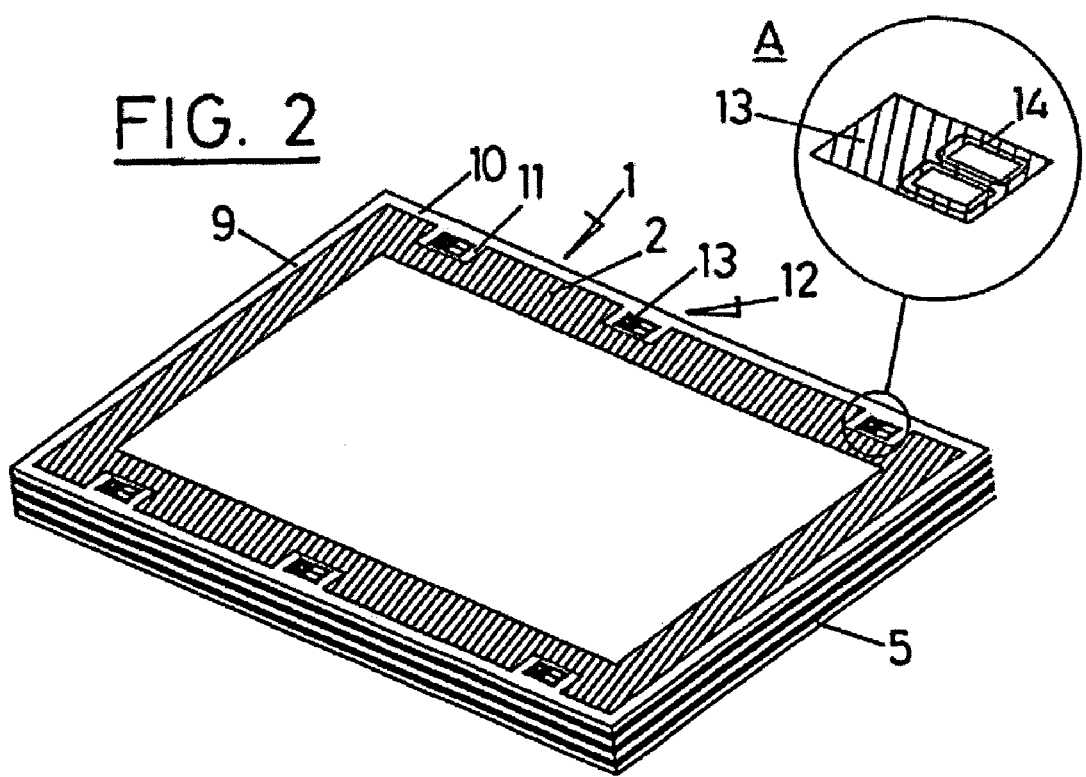
FIG. 2 is a view in perspective of the multilayer printed circuit prepared to be soldered.

In FIGS. 1 and 2, the respective views in perspective show the layers that make up the book of a multilayer printed circuit 1 composed of four layers containing the circuit image indicated with references 2, 3, 4, and 5, respectively and three isolating layers indicated with references 6, 7, and 8, respectively, all layers having a rectangular form of equal dimensions. In this example of performing the procedure according to the invented process, there is a total of seven constituent-layers in the internal book of the multilayer printed circuit, four containing the circuit image and three isolating ones, this number of layers being understood to serve solely as an example and in no way to limit the number of layers that could make up a multilayer printed circuit.

The figures in the pages of drawings show that the layers containing the circuit image 2 through 5 and the isolating layers 6 to 8 are superimposed in alternating order, such that the facing circuit images of the layers that contain circuit images are always separated by an isolating layer, and furthermore that they are all adapted so that the top and bottom layers of the resulting book of layers are layers containing the circuit image, a top circuit-image layer 2 and a bottom circuit-image layer 5.

FIG. 2 shows that the top circuit-image layer 2, on which, for reasons of simplicity, the illustration of any circuit has been omitted, is composed of a peripheral strip 9 that does not have the circuit image and includes three regularly distributed reserve areas 11 on each of its longitudinal margins 10. As previously indicated, the remaining layers containing circuit image 3, 4 and 5 are equipped with reserve areas of equal number and position to those described for the layer containing the circuit image 2, as seen in FIG. 1.

In the first phase of the procedure, according to the invention, there is a heater circuit 13, enlarged in detail A of FIG. 2, in each one of the reserve areas 11 of each layer containing a circuit image 2, 3, 4 y 5. The heater circuit 13 in this example of performing the process is composed of two turns in short-circuit 14, which bear symmetrical relation to the main theoretical longitudinal axis of the heater circuit 13; this particular layout of the turns in short-circuit 14 is given solely as a non-limiting example, since in reality the number of the turns in short-circuit that make up the heater circuit and their relative position can be configured in a variety of ways adapted to the specific needs of each case of application, particularly taking the following into consideration: material and thickness of the circuit layers; number of layers; soldering times, etc.

In the second phase of the invented procedure, the layers containing the circuit image 2, 3, 4 and 5 and the isolating layers 6, 7 and 8 are superimposed in alternating order, thereby producing, as previously indicated, a top layer containing the circuit image 2 and a bottom layer containing one as well 5, as seen in FIG. 2.

The third phase of the invented procedure, not shown here, proceeds to the securing of the positions of layers 2 through 8 of the multilayer printed circuit 1, thereby superimposing the groups 12 of reserve areas and, consequently, the heater circuits 13 that each contains.

The fourth and fifth phases of the invented procedure proceed to the soldering of the groups of reserve areas through the application of a magnetic field of variable induction to the heater circuits 13, using the machine described below.

Figure 3:
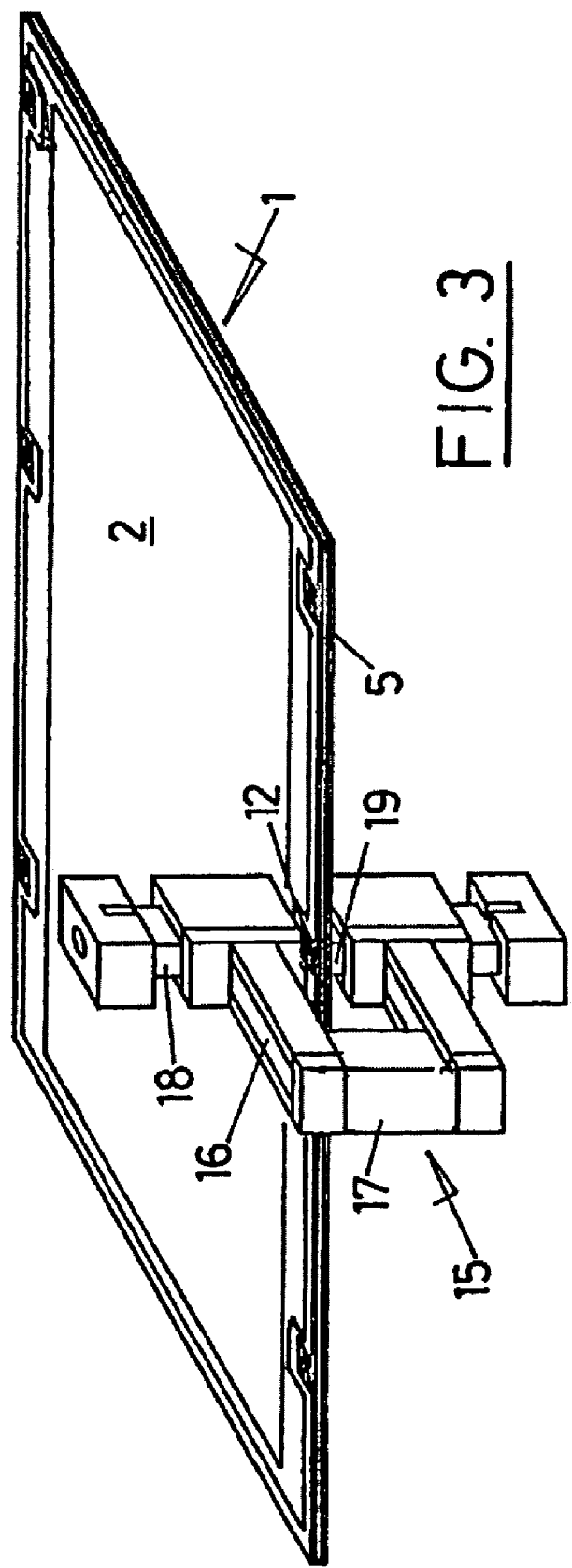
FIG. 3 is a schematic view in perspective of the machine for the invented procedure.

FIG. 3 shows, schematically, the machine to be employed for the invented process. For reasons of simplicity, the illustration of the circuit board holder has been omitted, since it is well known, as have been those of the attachment device for the book of layers of the multilayer printed circuit, and the movement control device for the circuit board holder.

In this example of the machine to be used in the invented procedure, FIG. 3 shows a single inductor device 15, it being understood that the number of constituent induction devices 15 in the machine and their arrangement with regard to the circuit board holder would depend on the production needs of each specific case of application; for instance, there could be two induction devices 15 facing each other, one on each side of multilayer printed circuit 1, operationally coordinated through the circuit board holder's movement control device.

Inductor device 15 is composed of a magnetic circuit 16 of a general U form, fitted out with an inductor coil 17 and two electrodes placed at the outer points of the arms of the magnetic circuit 16. The top electrode 18 and the bottom electrode 19 are arranged coaxially to each other and are perpendicular to the multilayer printed circuit 1. The inductor coil 17 is fed by a feeding source of alternating current, while the electrodes 18 and 19 have a displacement capacity in both directions.

The operation of the machine for the invented procedure is described below. Through the control device of the circuit board holder, the multilayer printed circuit 1 is positioned relative to the inductor device 15 in such a way that the electrodes 18 and 19 are situated perpendicularly to the group of reserve areas 12. In these conditions, an electrodes movement control device, not shown, proceeds to situate the top electrode 18 over the reserve area 11 of the layer containing the circuit image 2 and the bottom electrode 19 over the bottom layer containing the circuit image 5, facing the reserve area, such that the electrodes exercise a certain degree of pressure. Later, the inductor coil 17 is fed by alternating current, so that the electrodes 18 and 19 apply a magnetic field of variable induction that generates, through induction into the turns in short-circuit 14 of each heater circuit 13 of each reserve area 11 of each layer containing the circuit image 2, 3, 4 and 5, a current intensity whose circulation through the turns in short-circuit 14 produces the soldering heat of the layers of the multilayer printed circuit 1.

What is claimed is:

1. Procedure for soldering the constituent layers of a multilayer printed circuit, applicable to multilayer printed circuits made up of a mix of layers containing the circuit image (2, 3, 4 and 5) and isolating layers (6, 7 and 8), the layers with the circuit image (2, 3, 4, 5) having perimetral strips (9) where multiple reserve areas (11) are located in equal number and arrangement for each layer that includes the following steps:

i) place a heater circuit (13) composed of a flat winding with at least one turn in short-circuit (14) in the reserve area (11) of each layer containing the circuit image (2, 3, 4 and 5);

ii) arrange the layers containing the circuit image (2, 3, 4, 5) so that they are superimposed and separated from each other by an isolating layer (6, 7 and 8) in order to create the book of layers of the multilayer printed circuit, in which can be distinguished a top layer containing the circuit image (2) and a bottom layer containing the circuit image (5);

iii) secure the position of the layers (2, 3, 4, 5, 6, 7, 8) of the multilayer printed circuit (1), relative to each other, in such a way that the corresponding reserve areas (11) of the layers containing the circuit image (2, 3, 4, 5,) occupy the same relative position, thereby creating groups (12) of superimposed reserve areas (11) and, consequently, groups of superimposed heater circuits (13);

iv) in each group (12) of reserve areas (11), place one induction electrode (18) over the reserve area (11) of the top layer containing the circuit image (2), and a induction electrode (19) over the opposite side of the reserve area (11) of the bottom layer containing the circuit image (5); and v) solder each group (12) of reserve areas (11) by application through the two induction electrodes (18, 19) of a magnetic field of variable induction, that generates through induction in each of the turns in short-circuit (14) of each heater circuit (13) of each reserve area (11) of each layer containing the circuit image (2, 3, 4, , and 5) a current intensity whose circulation through the turns in short-circuit produces the heat necessary to solder the layers (2, 3, 4, 5, 6, 7, 8) of the multilayer printed circuit (1).

2. Machine for the procedure of claim 1, comprising:

a structure in which there is at least one inductor device (15) equipped with a magnetic circuit (16) of a general U form, fitted out with an inductor coil (17), each outer point of each arm of the magnetic circuit having its own inductor electrode (18, 19), both electrodes (18, 19) being arranged coaxially to each other and having a displacement capacity in both directions;

a circuit board holder;

a device to secure the book of layers (2, 3, 4, 5, 6, 7, 8) of a multilayer printed circuit (1) to the circuit board holder;

a movement control device for the circuit board holders, adapted to situate the groups (12) of reserve areas (11) of said multilayer printed circuit between the pair of induction electrodes (18, 19) of the inductor device (15) and perpendicularly to them; and a control device for each pair of induction electrodes (18, 19), adapted to place the electrodes in contact with the group (12) of reserve areas (11), such that they exercise pressure on them.

* * * * *